(12) United States Patent
Chiang et al.

(10) Patent No.: US 10,511,310 B2
(45) Date of Patent: *Dec. 17, 2019

(54) OVEN CONTROLLED CRYSTAL OSCILLATOR CONSISTING OF HEATER-EMBEDDED CERAMIC PACKAGE

(71) Applicant: TXC CORPORATION, Taipei (TW)

(72) Inventors: Chien-Wei Chiang, Ping Cheng (TW); Wan-Lin Hsieh, Ping Cheng (TW); Chia-Wei Chen, Ping Cheng (TW); Che-Lung Hsu, Ping Cheng (TW); Sheng-Hsiang Kao, Ping Cheng (TW); Chen-Ya Weng, Ping Cheng (TW); Chia-Chen Chen, Ping Cheng (TW)

(73) Assignee: TXC Corporation, Taipei (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/363,055

(22) Filed: Mar. 25, 2019

(65) Prior Publication Data

US 2019/0222214 A1    Jul. 18, 2019

Related U.S. Application Data

(63) Continuation of application No. 15/342,554, filed on Nov. 3, 2016, now Pat. No. 10,291,236.

(Continued)

(51) Int. Cl.
*H03L 1/02*    (2006.01)
*H03L 1/04*    (2006.01)
(Continued)

(52) U.S. Cl.
CPC ............ *H03L 1/028* (2013.01); *G01K 13/00* (2013.01); *H01L 23/345* (2013.01); *H03L 1/02* (2013.01);
(Continued)

(58) Field of Classification Search
CPC .... H05K 1/184; H05K 1/0306; H05K 1/0298; H05K 1/0201; H05K 2201/10151;
(Continued)

(56) References Cited

U.S. PATENT DOCUMENTS

| | | | | |
|---|---|---|---|---|
| 6,127,661 A | * | 10/2000 | Fry ........................ | H03L 1/022 219/497 |
| 6,559,728 B1 | * | 5/2003 | Fry ........................... | H03L 1/04 331/108 D |
| 7,196,405 B1 | * | 3/2007 | Ferreiro ............... | H03H 9/0514 257/659 |

FOREIGN PATENT DOCUMENTS

CN    102158194 A    8/2011
CN    104579227 A    4/2015

* cited by examiner

*Primary Examiner* — Arnold M Kinkead
(74) *Attorney, Agent, or Firm* — Rosenberg, Klein & Lee (57) ABSTRACT

An oven controlled crystal oscillator consisting of heater-embedded ceramic package includes a substrate, a crystal package, a crystal blank, a metal lid, a first IC chip, and a cover lid. The crystal package is mounted on the substrate, and a central bottom of the crystal package is provided with the first IC chip. The crystal blank is mounted in the crystal package and sealed by the metal lid. The crystal package has an embedded heater layer establishing a symmetric thermal field with respect to the first IC chip and the crystal blank. Alternatively, a heater-embedded ceramic carrier substrate is arranged between the first IC chip and the crystal blank to establish a symmetric thermal field with respect to the first IC chip and the crystal blank. The cover lid is combined with the substrate to cover the crystal package and the metal lid.

14 Claims, 13 Drawing Sheets

Related U.S. Application Data (60) Provisional application No. 62/308,323, filed on Mar. 15, 2016.

(51) Int. Cl.
    *G01K 13/00*     (2006.01)
    *H01L 23/34*     (2006.01)
    *H05K 1/18*     (2006.01)
    *H05K 1/02*     (2006.01)
    *H05K 1/03*     (2006.01)

(52) U.S. Cl.
CPC .............. *H03L 1/04* (2013.01); *H05K 1/0212* (2013.01); *H05K 1/181* (2013.01); *H05K 1/0298* (2013.01); *H05K 1/0306* (2013.01); *H05K 1/184* (2013.01); *H05K 2201/10075* (2013.01); *H05K 2201/10151* (2013.01)

(58) Field of Classification Search
CPC .................... H05K 2201/10075; H05K 1/181; H03L 1/02; H03L 1/028; H03L 1/04; H01L 23/498; H01L 23/345
USPC .................................................. 331/158, 176
See application file for complete search history.

OVEN CONTROLLED CRYSTAL OSCILLATOR CONSISTING OF HEATER-EMBEDDED CERAMIC PACKAGE

This application is a Continuation patent application of co-pending Ser. No. 15/342,554, filed on 3 Nov. 2016, currently pending.

BACKGROUND OF THE INVENTION

Field of the Invention

The present invention relates to a crystal oscillator, particularly to an oven controlled crystal oscillator consisting of heater-embedded ceramic package, wherein the heater-embedded ceramic package establishes a symmetric thermal field to achieve good thermal uniformity.

Description of the Related Art

Figure 1:
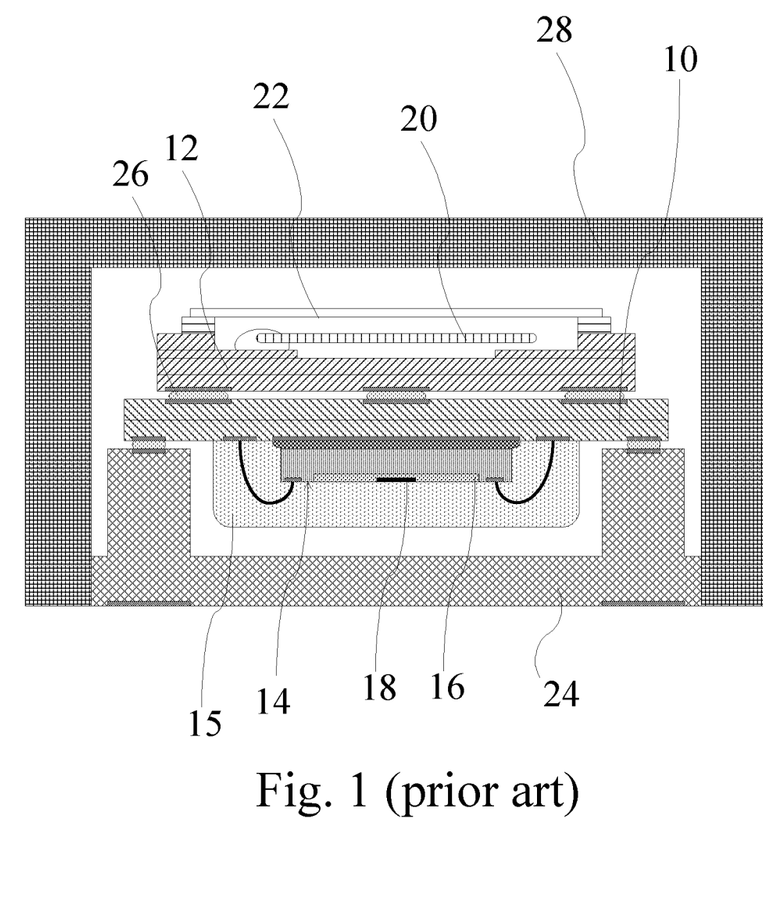
FIG. 1 is a diagram schematically showing an oven controlled crystal oscillator in a conventional technology.

As shown in FIG. 1, the main portion of an oven controlled crystal oscillator is a ceramic carrier substrate 10 that is located in the central region of the whole oven structure. Respectively above and beneath the ceramic carrier substrate 10 are a simple crystal package 12 and an IC chip 14. The IC chip 14 includes a heater 16, a temperature sensor 18, an oscillator circuit, and a temperature control circuit. The IC chip 14 is coated with an overcoating filling 15. The crystal blank 20 is mounted in the cavity of the simple crystal package 12 and sealed with a metal lid 22. After crystal blank 20 and IC chip 14 assembly, the main ceramic carrier substrate 10 together with the simple crystal package 12 and IC chip 14 is mounted to a PCB substrate 24 by connecting solder 26, combining an exterior cover lid 28 to form an airtight chamber space.

Figure 2:
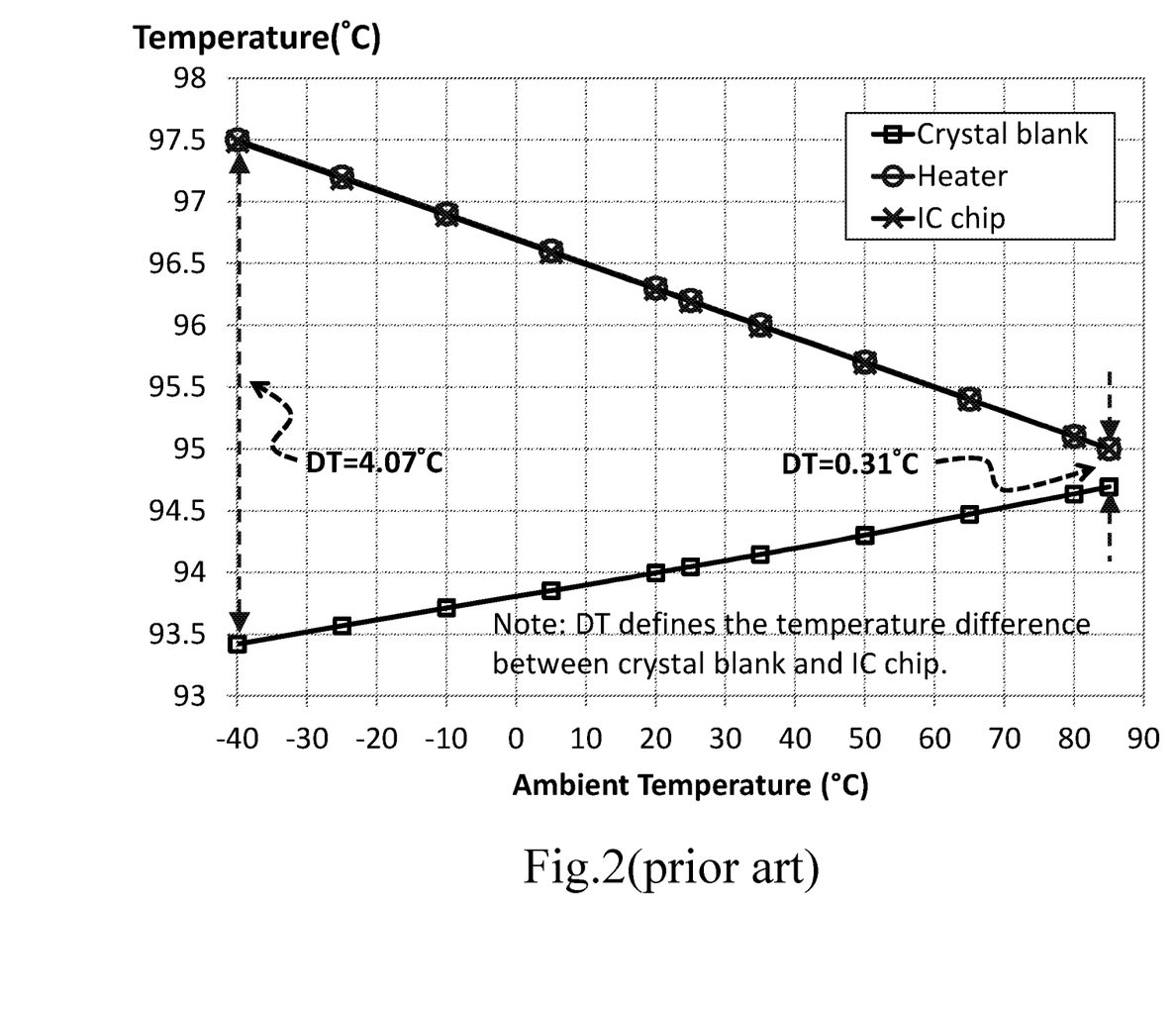
FIG. 2 is a diagram schematically showing thermal gradient in an asymmetric oven controlled crystal oscillator in the conventional technology.

In the oven controlled crystal oscillator, the heater 16 that is used to maintain the specific working temperature is integrated inside the IC chip 14. Another key element, temperature sensor 18 is also integrated inside the IC chip 14. The crystal blank 20 is heated by the heater 16 at beneath from the surface of IC chip 14 and through the ceramic carrier substrate 10 and solder 26. The structure is asymmetric with respect to the heater 16 therefore the temperature difference between crystal blank 20 and IC chip 14 is big, the temperature uniformity of structure is thus not good enough, so it affects the effect of controlling the oven temperature. As shown in FIG. 2, the temperature of the IC chip 14 is very close to that of the heater 16 when the oven controlled crystal oscillator works at an ambient temperature. The temperature difference between the crystal blank 20 and the IC chip 14 is 4.07° C. when the oven controlled crystal oscillator works at an ambient temperature of −40° C. The temperature difference between the crystal blank 20 and the IC chip 14 is 0.31° C. when the oven controlled crystal oscillator works at an ambient temperature of about 88° C. In other words, the temperature difference between the crystal blank 20 and the IC chip 14 is larger when the oven controlled crystal oscillator works at a lower ambient temperature. This is because the heater 16 transmits heat from the IC chip 14 to the crystal blank 20 to result in linear temperature gradient between them. The linear temperature gradient can establish an asymmetric thermal field and result in bad thermal uniformity.

To overcome the abovementioned problems, the present invention provides an oven controlled crystal oscillator consisting of heater-embedded ceramic package, so as to solve the afore-mentioned problems of the prior art.

SUMMARY OF THE INVENTION

A primary objective of the present invention is to provide an oven controlled crystal oscillator consisting of heater-embedded ceramic package, which installs an integrated circuit chip and a crystal blank at two opposite sides of an embedded heater layer, whereby the embedded heater layer establishes a symmetric thermal field, so as to achieve good thermal uniformity, maintain the oven stability and reduce the power consumption.

To achieve the abovementioned objectives, the present invention provides an oven controlled crystal oscillator consisting of heater-embedded ceramic package, which comprises a substrate, a heater-embedded crystal ceramic package, a crystal blank, a metal lid, a first integrated circuit (IC) chip, first wires, a filling, solder and a cover lid. A central top of the substrate is provided with a first cavity. The heater-embedded crystal ceramic package has a first embedded heater layer, is mounted on the substrate through the solder and mounted above the first cavity, and a top of the heater-embedded crystal ceramic package is provided with a second cavity, and a central bottom of the heater-embedded crystal ceramic package is arranged above the first cavity. The crystal blank is mounted on the heater-embedded crystal ceramic package and in the second cavity. The metal lid is mounted on the heater-embedded crystal ceramic package to seal the second cavity. The first IC chip is mounted on the central bottom of the heater-embedded crystal ceramic package, and the first IC chip has a first temperature sensor, and the first embedded heater layer establishes a symmetric thermal field with respect to the first IC chip and the crystal blank, and the first IC chip and the crystal blank are structurally symmetric to the first embedded heater layer, and the first IC chip is connected with the heater-embedded crystal ceramic package through the first wires, and the first IC chip and the first wires are coated with the filling. The cover lid covers the heater-embedded crystal ceramic package and the metal lid and is combined with the substrate to form a chamber.

The present invention also provides an oven controlled crystal oscillator consisting of heater-embedded ceramic package, which comprises a print circuit board (PCB) substrate, a heater-embedded ceramic carrier substrate, a crystal package, a crystal blank, an integrated circuit (IC) chip, wires, an overcoating filling, first solder, second solder and a cover lid. A central top of the PCB substrate is provided with a first cavity. The heater-embedded ceramic carrier substrate has a first embedded heater layer, is mounted on the PCB substrate through the first solder and mounted above the first cavity. The crystal package is mounted on the heater-embedded ceramic carrier substrate through the second solder, and a top of the crystal package is provided with a second cavity. The crystal blank is mounted on the crystal package and in the second cavity. The metal lid is mounted on the crystal package to seal the second cavity. The IC chip is mounted on a bottom of the heater-embedded ceramic carrier substrate and in the first cavity, and the IC chip has a temperature sensor, and the first embedded heater layer establishes a symmetric thermal field with respect to the IC chip and the crystal blank, and the IC chip is connected with the heater-embedded ceramic carrier substrate through the wires, and the IC chip and the wires are coated with the overcoating filling. The cover lid covers the PCB substrate, the crystal package, the heater-embedded ceramic carrier substrate and the metal lid and is combined with the PCB substrate to form an airtight chamber space.

The present invention further provides an oven controlled crystal oscillator consisting of heater-embedded ceramic package, which comprises a print circuit board (PCB) substrate, a ceramic carrier substrate, a heater-embedded crystal package, a crystal blank, a metal lid, an integrated circuit (IC) chip and a cover lid. The central top of the PCB substrate is provided with a first cavity. The ceramic carrier substrate is mounted on the PCB substrate through first solder and mounted above the first cavity. The heater-embedded crystal package has an embedded heater layer and is mounted on the ceramic carrier substrate through second solder, and a top of the heater-embedded crystal package is provided with a second cavity. The crystal blank is mounted on the heater-embedded crystal package and in the second cavity. The metal lid is mounted on the heater-embedded crystal package to seal the second cavity. The IC chip is mounted on a bottom of the ceramic carrier substrate and in the first cavity. The IC chip has a temperature sensor, and the embedded heater layer establishes a symmetric thermal field with respect to the IC chip and the crystal blank, and the IC chip is connected with the ceramic carrier substrate through wires, and the IC chip and the wires are coated with an overcoating filling. The cover lid covers the PCB substrate, the heater-embedded crystal package, the ceramic carrier substrate and the metal lid and is combined with the PCB substrate to form an airtight chamber space.

Below, the embodiments are described in detail in cooperation with the drawings to make easily understood the technical contents, characteristics and accomplishments of the present invention.

DETAILED DESCRIPTION OF THE INVENTION

Reference will now be made in detail to embodiments illustrated in the accompanying drawings. Wherever possible, the same reference numbers are used in the drawings and the description to refer to the same or like parts. In the drawings, the shape and thickness may be exaggerated for clarity and convenience. This description will be directed in particular to elements forming part of, or cooperating more directly with, methods and apparatus in accordance with the present disclosure. It is to be understood that elements not specifically shown or described may take various forms well known to those skilled in the art. Many alternatives and modifications will be apparent to those skilled in the art, once informed by the present disclosure.

Figure 3:
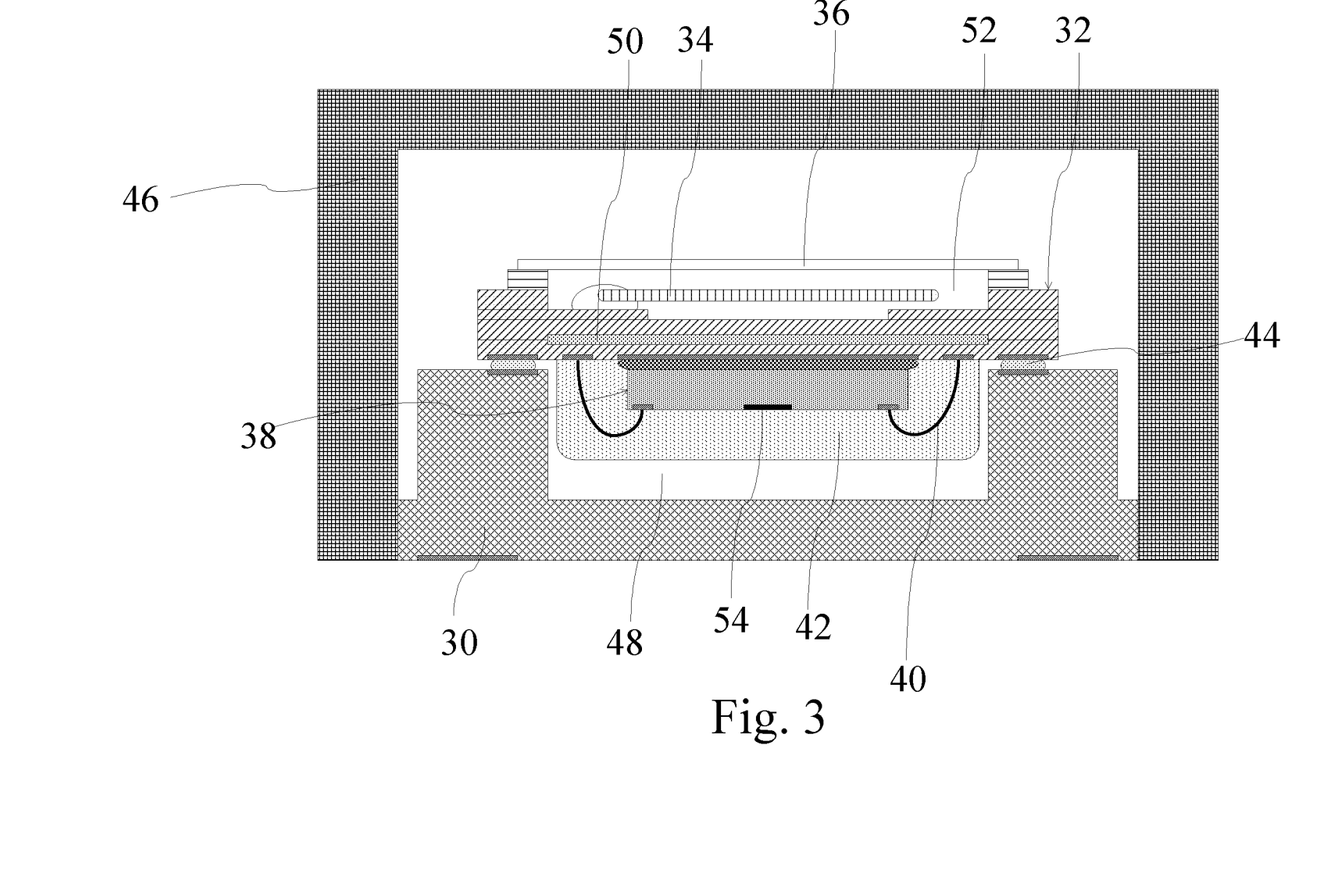
FIG. 3 is a diagram schematically showing an oven controlled crystal oscillator according to the first embodiment of the present invention.
Figure 4:
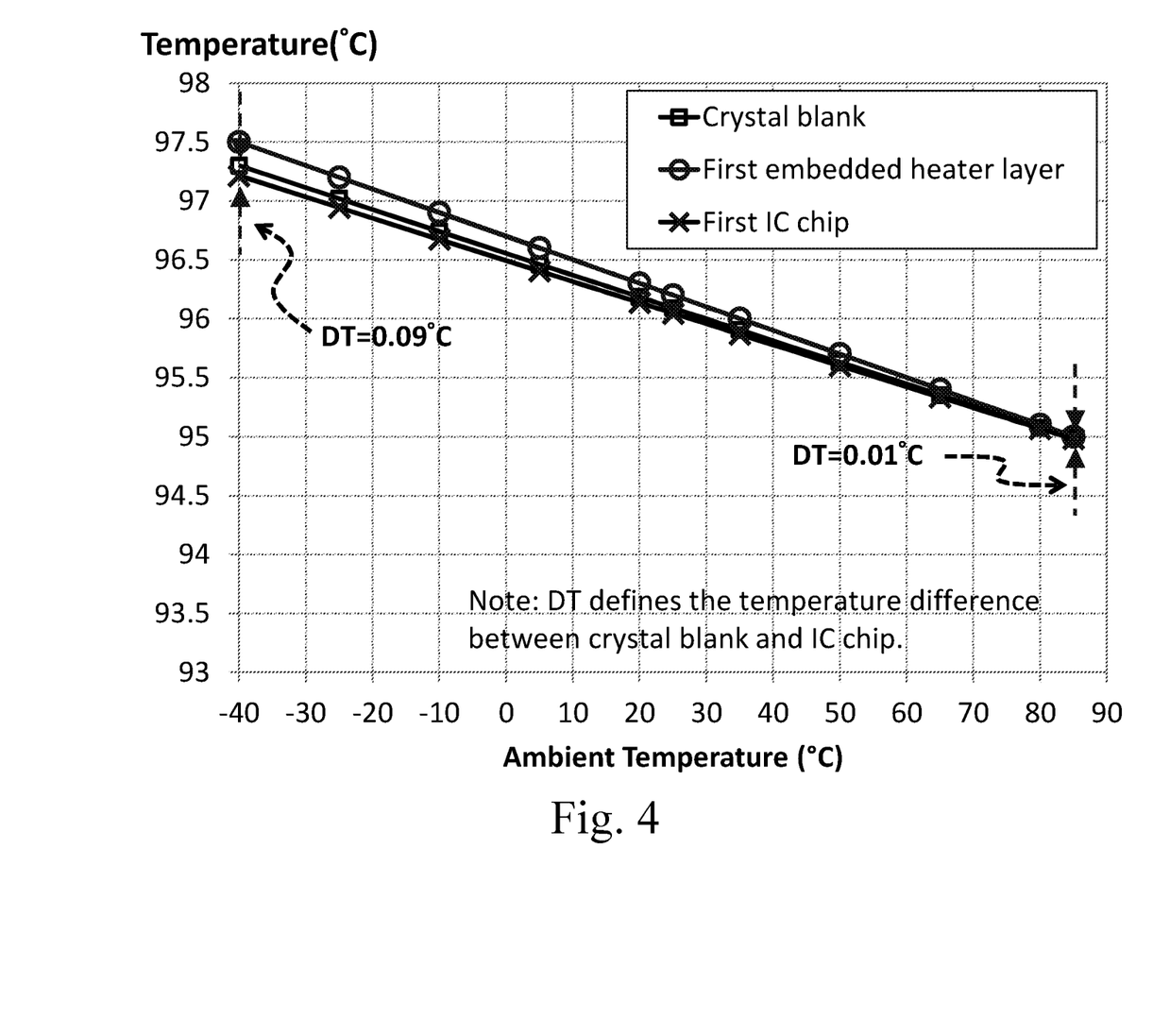
FIG. 4 is a diagram schematically showing thermal gradient in a symmetric oven controlled crystal oscillator according to the first embodiment of the present invention.

Refer to FIG. 3 and FIG. 4. The first embodiment of the present invention is introduced as below. The oven controlled crystal oscillator (OCXO) consisting of heater-embedded ceramic package comprises a substrate 30, a heater-embedded crystal ceramic package 32, a crystal blank 34, a metal lid 36, a first integrated circuit (IC) chip 38 without a heater, first wires 40, a filling 42, solder 44 and a cover lid 46. The substrate 30 is exemplified by a print circuit board (PCB) substrate. A central top of the substrate 30 is provided with a first cavity 48. The heater-embedded crystal ceramic package 32 has a first embedded heater layer 50, is mounted on the substrate 30 through the solder 44 and mounted above the first cavity 48, and a top of the heater-embedded crystal ceramic package 32 is provided with a second cavity 52, and a central bottom of the heater-embedded crystal ceramic package 32 is arranged above the first cavity 48. The crystal blank 34 is mounted on the heater-embedded crystal ceramic package 32 and in the second cavity 52. The metal lid 36 is mounted on the heater-embedded crystal ceramic package 32 to seal the second cavity 52. The first IC chip 38 is mounted on the central bottom of the heater-embedded crystal ceramic package 32, and the first IC chip 38 and the crystal blank 34 are arranged at two opposite sides of the first embedded heater layer 50, and the first IC chip 38 has a first temperature sensor 54, and the first embedded heater layer 50 establishes a symmetric thermal field with respect to the first IC chip 38 and the crystal blank 34, and the first IC chip 38 and the crystal blank 34 are structurally symmetric to the first embedded heater layer 50, and the first IC chip 38 is connected with the heater-embedded crystal ceramic package 32 through the first wires 40, and the first IC chip 38 and the first wires 40 are coated with and protected by the filling 42. The first IC chip 38, the first wires 40 and the filling 42 are mounted in the first cavity 48. The cover lid 46 covers the heater-embedded crystal ceramic package 32 and the metal lid 36 and is combined with the substrate 30 to form an airtight chamber space.

In the first embodiment, the crystal blank 34 and the first IC chip 38 is structurally symmetric to the first embedded heater layer 50, thus the first embedded heater layer 50 uniformly heats the structure upward and downward simultaneously. Because the structure is symmetric, the temperature gradient between the crystal blank 34 and the first IC chip 38 is quite small, meaning that the thermal uniformity is good. As shown in FIG. 4, the temperature difference between the crystal blank 34 and the first IC chip 38 is 0.09° C. when the oven controlled crystal oscillator works at an ambient temperature of −40° C. The temperature difference between the crystal blank 34 and the first IC chip 38 is 0.01° C. when the oven controlled crystal oscillator works at an ambient temperature of about 88° C. In other words, the temperature of the first IC chip 38 is very close to that of the crystal blank 34 when the oven controlled crystal oscillator works at an ambient temperature. As a result, the temperature-control effect of oven is good as well. And the embedded heater has good thermal conductivity that is helpful in maintaining the thermal efficiency of controlling oven temperature to achieve good thermal uniformity, maintain the oven stability and reduce the power consumption.

Figure 5:
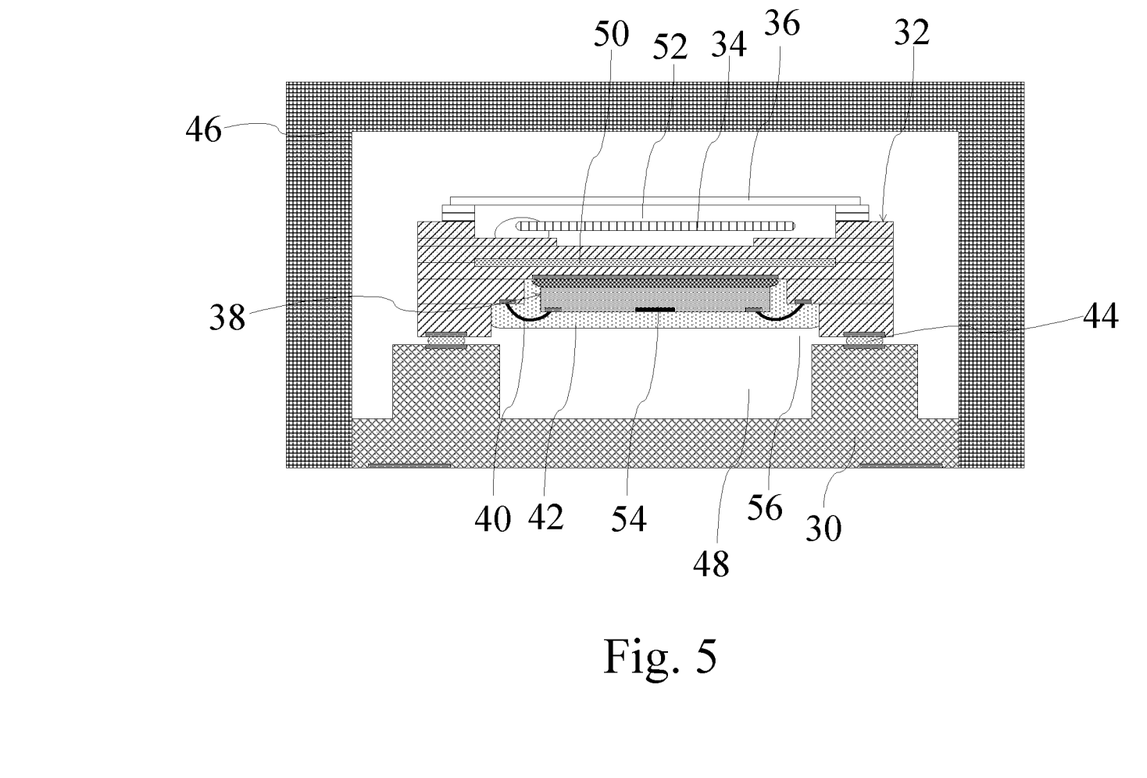
FIG. 5 is a diagram schematically showing an oven controlled crystal oscillator according to the second embodiment of the present invention.

Refer to FIG. 3 and FIG. 5. The second embodiment of the present invention is introduced as below. The second embodiment is different from the first embodiment in the structure of the heater-embedded crystal ceramic package 32 and the positions of the first IC chip 38, the first wires 40 and the filling 42. Compared with the first embodiment, the central bottom of the heater-embedded crystal ceramic package 32 of the second embodiment is further provided with a third cavity 56, and the first IC chip 38, the first wires 40 and the filling 42 are mounted in the third cavity 56. As shown in FIG. 3, the assembly of IC chip 38 to heater-embedded crystal ceramic package 32 uses an overcoating filling process to protect the IC chip 38 and corresponding IC bonding wires 40 to the pads on heater-embedded crystal ceramic package 32 because of the bottom planar structure of heater-embedded crystal ceramic package 32, and the overcoating filling is a complex process. As shown in FIG. 5, it is an extension of FIG. 3 to disclose a simpler structure to replace the heater-embedded crystal ceramic package 32 to simplify the overcoating filling process by using H-type heater-embedded crystal ceramic package 32. The first embodiment uses a planar structure in the bottom side of the heater-embedded crystal ceramic package 32 while the second embodiment uses a cavity structure in the bottom side that is used to assemble the first IC chip 38. In the second embodiment, the first IC chip 38 is mounted into the third cavity 56 and the first wires 40 bonded to the pads of the heater-embedded crystal ceramic package 32, and then using an underfilling to fill up the third cavity 56 to protect the first IC chip 38 and the first wires 40. Therefore, the underfilling process is simpler than overcoating process. The second embodiment is also a symmetrical structure such as the first embodiment, so the second embodiment can achieve good oven temperature-control as well.

The abovementioned embodiments use the PCB substrate combining with heater-embedded ceramic crystal package to form a symmetric oven structure to achieve good thermal uniformity which results in good oven stability. However, the structure is not good in hermeticity. And the cost of PCB substrate is higher than ceramic substrate.

Figure 6:
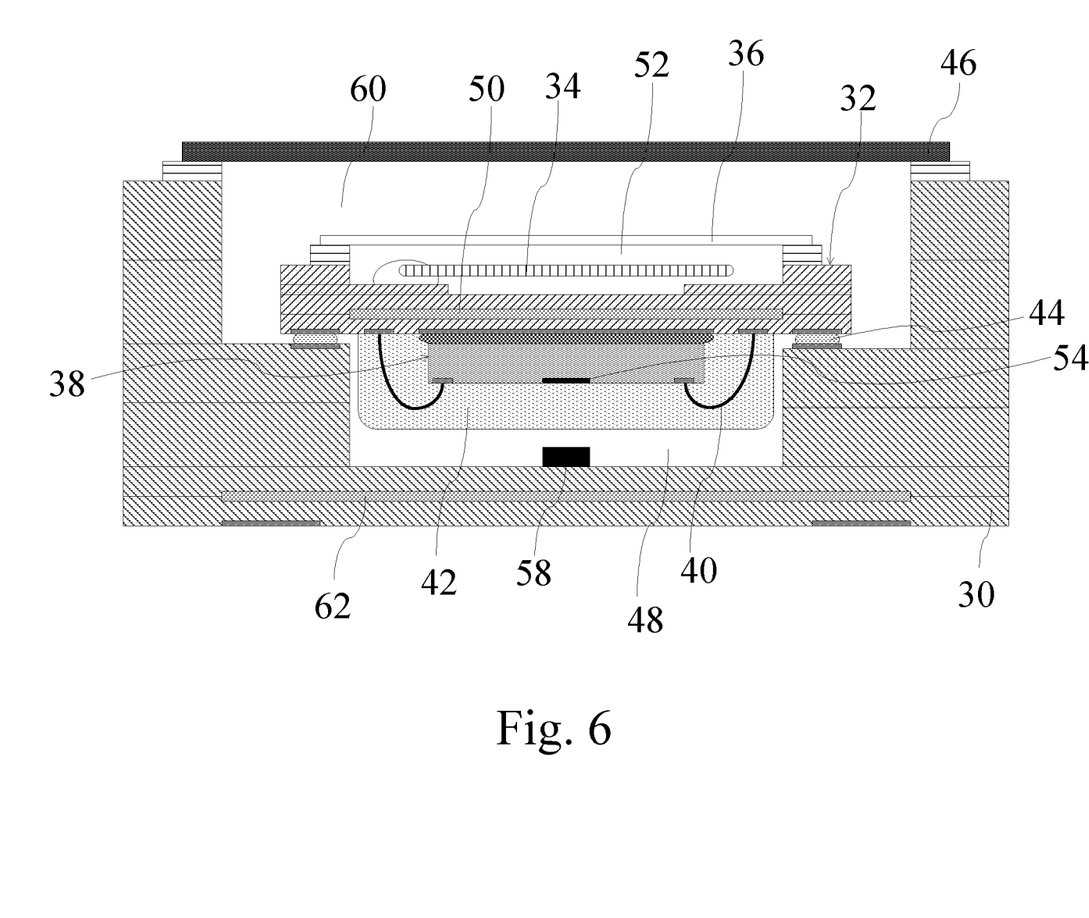
FIG. 6 is a diagram schematically showing an oven controlled crystal oscillator according to the third embodiment of the present invention.

Refer to FIG. 6. The third embodiment of the present invention is introduced as below. The third embodiment is different from the first embodiment in the structures of the substrate 30 and the cover lid 46. Besides, compared with the first embodiment, the third embodiment further comprises a second temperature sensor 58. In the third embodiment, the central top of the substrate 30 is further provided with a fourth cavity 60 connected with and arranged above the first cavity 48, and the fourth cavity 60 is larger than the first cavity 48, and the heater-embedded crystal ceramic package 32 and the metal lid 36 are mounted in the fourth cavity 60, and the substrate 30 is a heater-embedded ceramic substrate having a second embedded heater layer 62 under the first cavity 48 to avoid thermal dissipation, and the second temperature sensor 58 is mounted on the heater-embedded ceramic substrate and in the first cavity 48, and the cover lid 46 seals the first cavity 48 and the fourth cavity 60 to form a hermetic vacuum chamber, and the cover lid 46 is a metal lid.

As show in FIG. 6, it further disclosures a structure that uses a heater-embedded ceramic substrate to replace the bottom PCB substrate in the first and second embodiments. Compared with the PCB substrate, ceramic substrate has lower cost and simpler structure that is easy for mass production for cost saving. And the heater-embedded ceramic substrate is sealed with an exterior metal lid to form a hermetically vacuum chamber that means the interior oven chamber is thermal isolated to minimize the thermal loss of the heat distribution of oven. For the crystal site, it is the same to the first embodiment that respectively assembled with the crystal blank 34 and the first IC chip 38 in top and bottom sides of the heater-embedded crystal ceramic package 32. Finally the heater-embedded ceramic substrate is sealed with an exterior metal lid to form a hermetic vacuum oven chamber.

In the third embodiment, the temperature stability of the crystal blank 34 and the first IC chip 38 is maintained by the first embedded heater layer 50 and the first temperature sensor 54. The second embedded heater layer 62 combined with a discrete and independent second temperature sensor 58 and also controlled by the first IC chip 38 is used to decrease the thermal dissipation and effects caused by variation of exterior ambient temperature change, thereby achieving very high stability of the oven structure.

Figure 7:
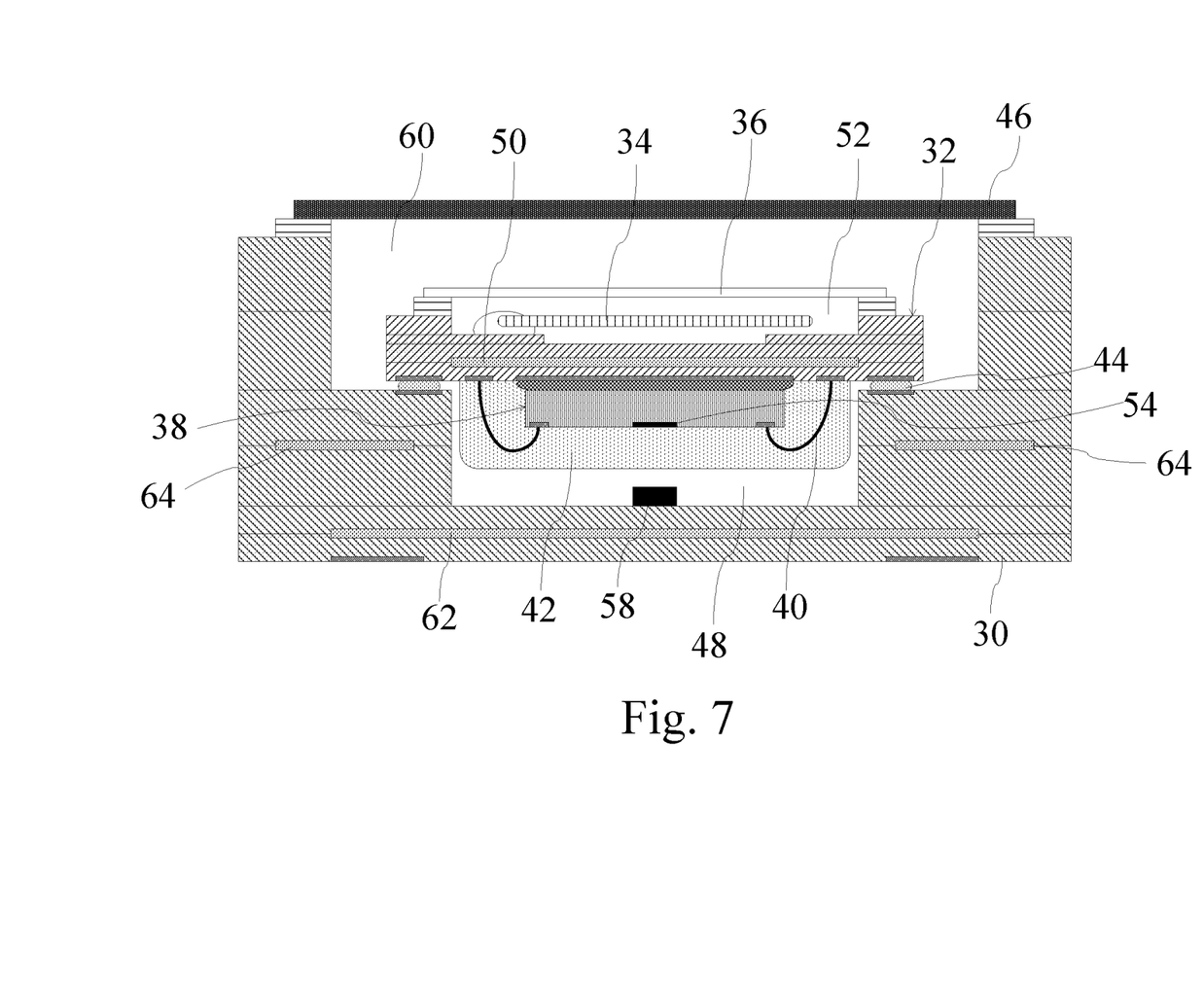
FIG. 7 is a diagram schematically showing an oven controlled crystal oscillator according to the fourth embodiment of the present invention.

Refer to FIG. 7. The fourth embodiment of the present invention is introduced as below. The fourth embodiment is different from the third embodiment in the structure of the substrate 30. Compared with the third embodiment, the heater-embedded ceramic substrate of the fourth embodiment further has at least one third embedded heater layer 64 surrounding the first cavity 48 and arranged over the second embedded heater layer 62 to avoid thermal dissipation. For example, the amount of the third embedded heater layer 64 is one. The second embedded heater layer 62 and the third embedded heater layer 64 can achieve better oven temperature control to decrease the effects caused by variation of exterior ambient temperature change. Combing the highly hermetic sealing of ceramic substrate and vacuum sealing inside the oven chamber, the third embodiment can form a highly-efficient miniaturized oven that is similar to a double-oven structure to highly improve the oven stability to increase the temperature stability of crystal oscillator.

Figure 8:
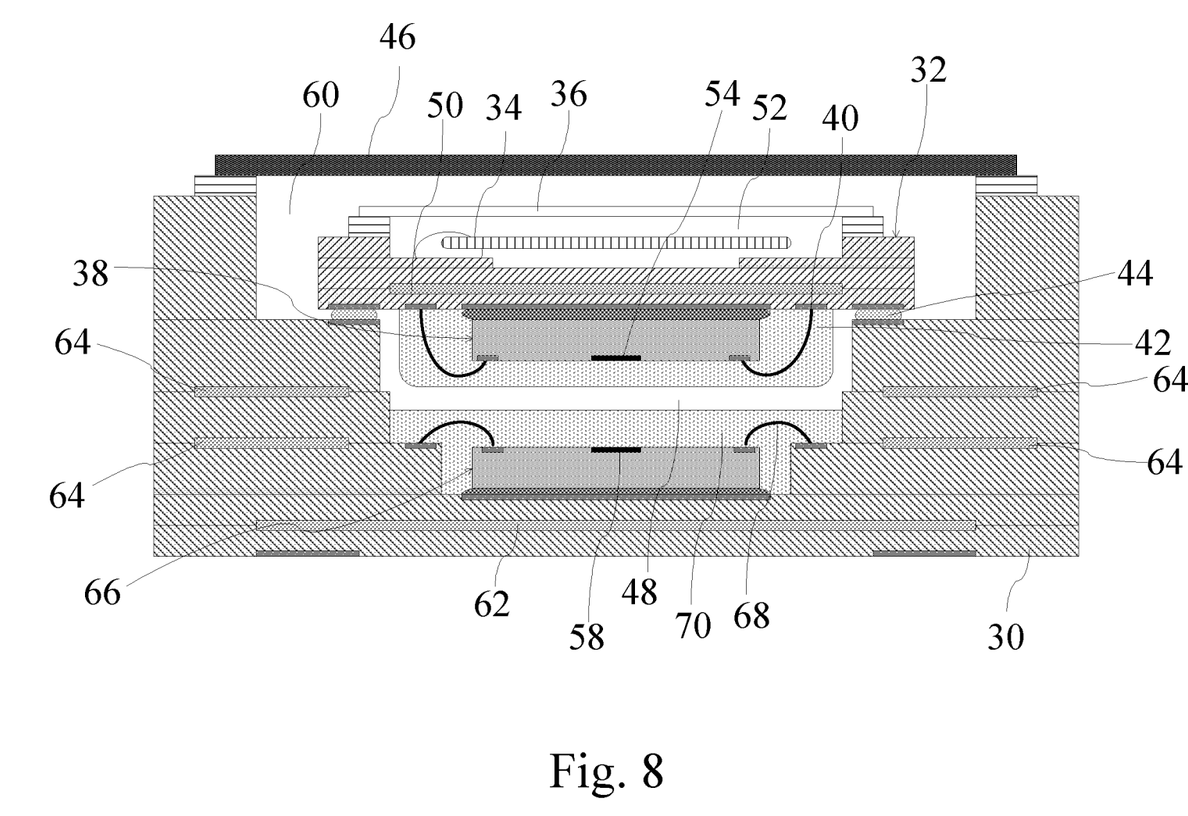
FIG. 8 is a diagram schematically showing an oven controlled crystal oscillator according to the fifth embodiment of the present invention.

Refer to FIG. 8. The fifth embodiment of the present invention is introduced as below. The fifth embodiment is different from the fourth embodiment in the position of the second temperature sensor 58 and the amount of the third embedded heater layers 64. Besides, compared with the fourth embodiment, the fifth embodiment further comprises a second IC chip 66 without a heater, second wires 68 and an underfilling 70. In the fifth embodiment, the second IC chip 66 is mounted on the heater-embedded ceramic substrate and in the first cavity 48, and the amount of the third embedded heater layers 64 is two, and the second temperature sensor 58 is integrated in the second IC chip 66, and the second IC chip 66 is connected with the heater-embedded ceramic substrate through the second wires 68, and the second IC chip 66 and the second wires 68 are coated with the underfilling 70. The second IC chip 66 is combined with the second temperature sensor 58, the second embedded heater layer 62 and the third embedded heater layers 64 to better control the temperature of the bottom heater-embedded ceramic substrate. Therefore, the fifth embodiment can provide a miniaturized double oven structure with very high thermal efficiency and high oven stability.

The third, fourth and fifth embodiments disclose three types of OCXO using heater-embedded ceramic substrate. The ceramic substrate can combine an exterior metal lid to form a hermetic sealing to achieve hermetic package, thereby achieving very good oven stability. However, the oven temperature can still be affected through the exterior metal lid at top side of the package.

Figure 9:
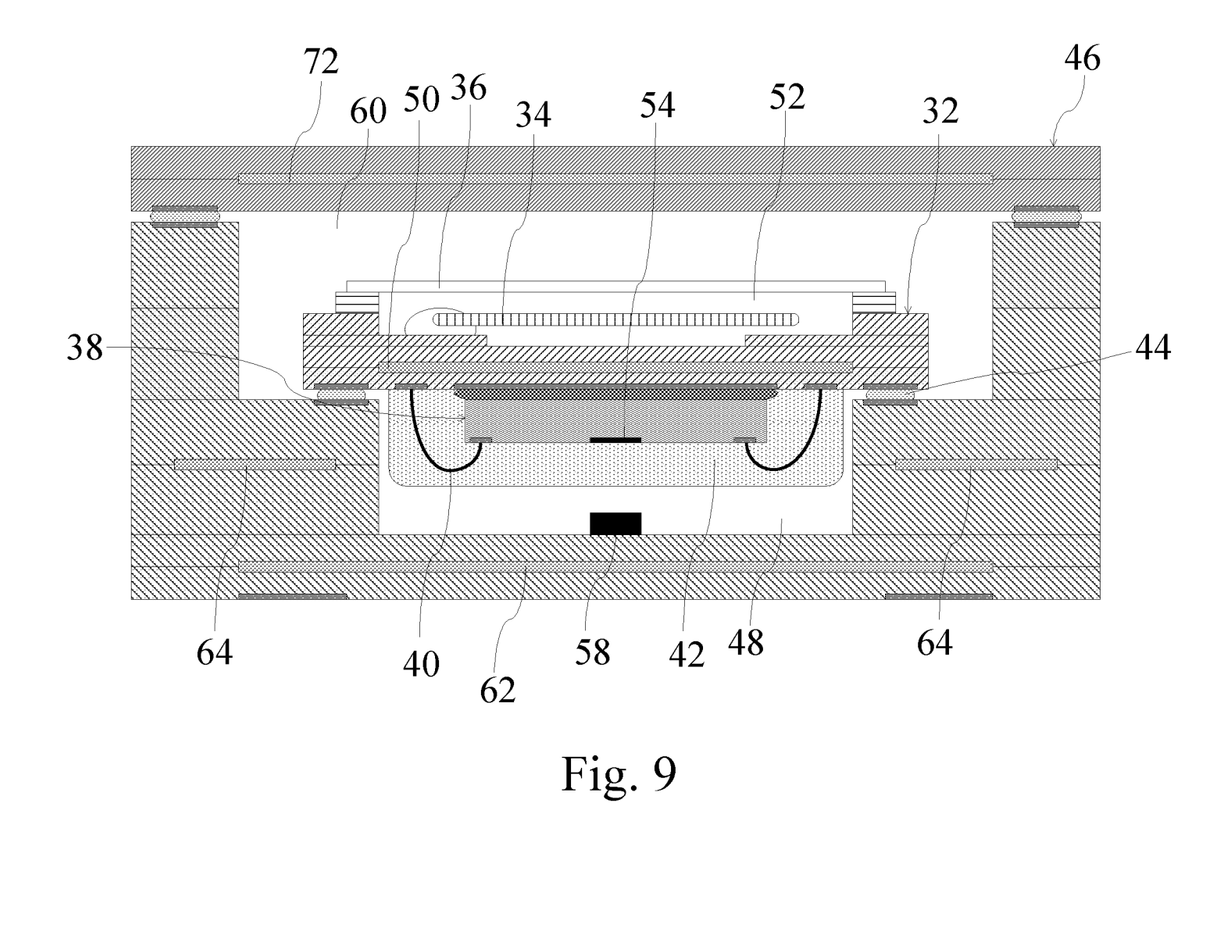
FIG. 9 is a diagram schematically showing an oven controlled crystal oscillator according to the sixth embodiment of the present invention.

Refer to FIG. 9. The sixth embodiment of the present invention is introduced as below. The sixth embodiment is different from the fourth embodiment in the structure of the cover lid 46. In the sixth embodiment, the cover lid 46 is a heater-embedded ceramic lid mounted on the heater-embedded ceramic substrate to seal the first cavity 48 and the fourth cavity 60 to form the hermetic vacuum chamber, and the heater-embedded ceramic lid has a fourth embedded heater layer 72 above the metal lid 36 to avoid thermal dissipation.

As shown in FIG. 9, it is an extension to the third, fourth and fifth embodiments to solve the problem which is resulted from the interface between exterior ambient temperature and top exterior metal lid in the third, fourth and fifth embodiments. The sixth embodiment further uses an exterior heater-embedded ceramic lid to replace the exterior metal lid. The second embedded heater layer 62, the third embedded heater layer 64 and the fourth embedded heater layer 72 are together to be controlled with the second temperature sensor 58 and the first IC chip 38. The whole heater-embedded ceramic substrate is combined with the exterior heater-embedded ceramic lid to form a hermetic package with an inner vacuum oven chamber, and thus the inner heater-embedded crystal ceramic package 32 thermally is isolated to fight against the exterior temperature variation. Inside the chamber, the temperature of crystal blank 36 and the first IC chip 38 are maintained by the first embedded heater layer 50. The sixth embodiment is a miniaturized double oven structure that can significantly raise the temperature stability of crystal oscillator.

Figure 10:
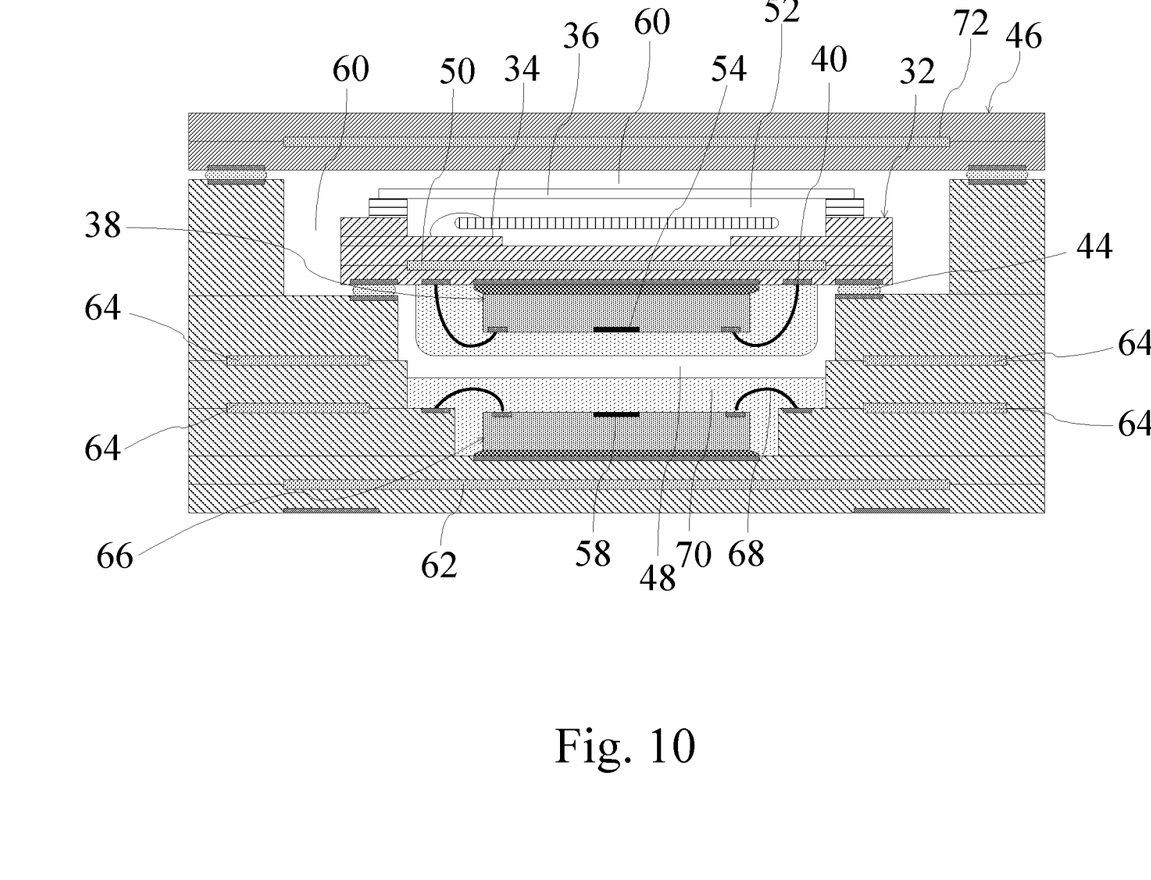
FIG. 10 is a diagram schematically showing an oven controlled crystal oscillator according to the seventh embodiment of the present invention.

Refer to FIG. 10. The seventh embodiment of the present invention is introduced as below. The seventh embodiment is different from the fifth embodiment in the structure of the cover lid 46. In the seventh embodiment, the cover lid 46 is a heater-embedded ceramic lid mounted on the heater-embedded ceramic substrate to seal the first cavity 48 and the fourth cavity 60 to form the hermetic vacuum chamber, and the heater-embedded ceramic lid has a fourth embedded heater layer 72 above the metal lid 36 to avoid thermal dissipation.

The seventh embodiment is the same to the fifth embodiment which also uses the second IC chip 66 to control the second embedded heater layer 62, the third embedded heater layer 64 and the fourth embedded heater layer 72 to achieve better effect in controlling the oven temperature. The seventh embodiment can cover the whole temperature-controlled heater-embedded crystal ceramic package 32 by using a temperature-controlled heater-embedded ceramic substrate combined with the exterior heater-embedded ceramic lid, and thus the heater-embedded crystal ceramic package 32 is within a vacuum-sealed thermal isolated chamber to minimize the thermal dissipation of the oven and to fight against the effects caused by variation of exterior ambient temperature change. Therefore, the seventh embodiment can form a very small double oven structure and significantly raise the temperature stability of miniaturized crystal oscillator.

Figure 11:
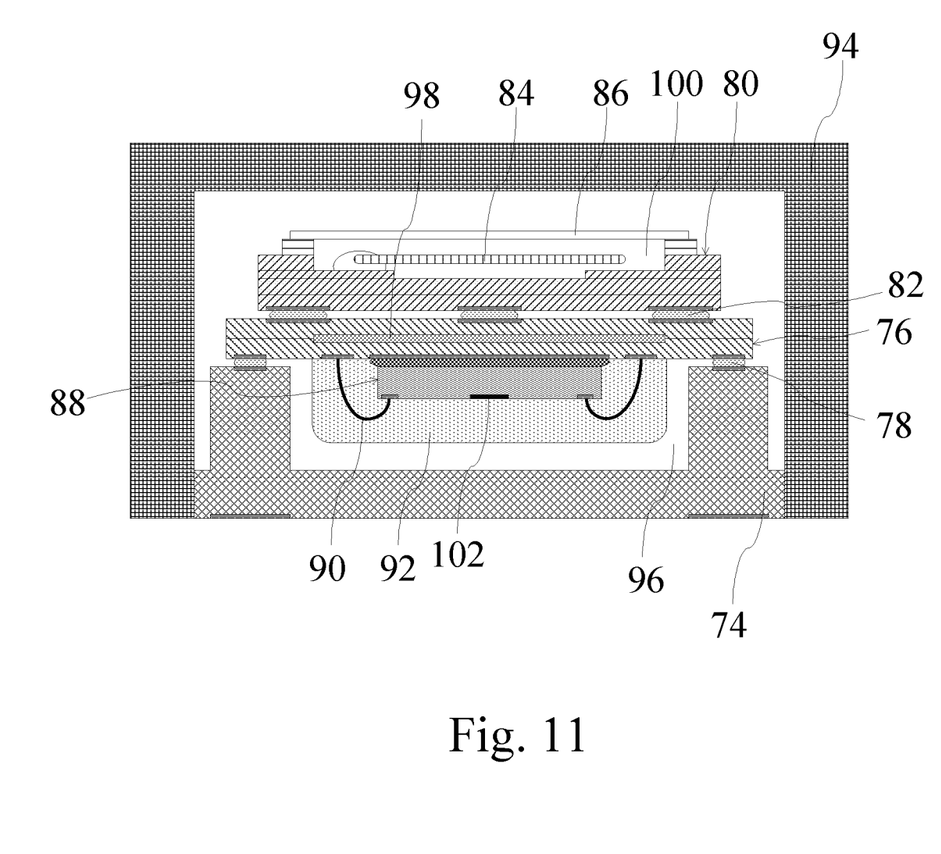
FIG. 11 is a diagram schematically showing an oven controlled crystal oscillator according to the eighth embodiment of the present invention.

Refer to FIG. 11. The eighth embodiment of the present invention is introduced as below. The oven controlled crystal oscillator consisting of heater-embedded ceramic package comprises a print circuit board (PCB) substrate 74, a heater-embedded ceramic carrier substrate 76, first solder 78, a crystal package 80, second solder 82, a crystal blank 84, a metal lid 86, an integrated circuit (IC) chip 88 without a heater, wires 90, an overcoating filling 92, and a cover lid 94. A central top of the PCB substrate 74 is provided with a first cavity 96. The heater-embedded ceramic carrier substrate 76 has a first embedded heater layer 98, and is mounted on the PCB substrate 74 through the first solder 78 and mounted above the first cavity 96. The crystal package 80 is mounted on the heater-embedded ceramic carrier substrate 76 through the second solder 82, and a top of the crystal package is provided with a second cavity 100. The crystal blank 84 is mounted on the crystal package 80 and in the second cavity 100. The metal lid 86 is mounted on the crystal package 80 to seal the second cavity 100. The IC chip 88 is mounted on a bottom of the heater-embedded ceramic carrier substrate 76 and in the first cavity 96, and the IC chip 88 has a temperature sensor 102, and the IC chip 88 and the crystal blank 84 are arranged at two opposite sides of the first embedded heater layer 98, and the first embedded heater layer 98 establishes a symmetric thermal field with respect to the IC chip 88 and the crystal blank 84, and the IC chip 88 is connected with the heater-embedded ceramic carrier substrate 76 through the wires 90, and the IC chip 88 and the wires 90 are coated with the overcoating filling 92. If the IC chip 88 is directly arranged on the crystal package 80, the crystal blank 84, the IC chip 88 and the crystal package 80 have to be together replaced when the crystal blank 84 fails. However, in the eighth embodiment, the IC chip 88 is arranged on the heater-embedded ceramic carrier substrate 76. As a result, the IC chip 88 can be saved to avoid waste when the crystal blank 84 fails. The cover lid 94 covers the PCB substrate 74, the crystal package 80, the heater-embedded ceramic carrier substrate 76 and the metal lid 86 and combined with the PCB substrate 74 to form an airtight chamber space.

The first embedded heater layer 98 heats the structure upward and downward simultaneously, and thus the thermal uniformity is good. As a result, the thermal gradient between the IC chip 88 and the crystal blank 84 is small. Therefore, the structure can achieve very good stability in controlling the oven temperature and good thermal uniformity, maintain good temperature stability of crystal oscillator, and reduce the power consumption. To minimize the temperature difference between the simple crystal package 80 and the heater-embedded ceramic carrier substrate 76, it is useful to use additional thermal conducting material in the interface between the simple crystal package 80 and the heater-embedded ceramic carrier substrate 76.

Figure 12:
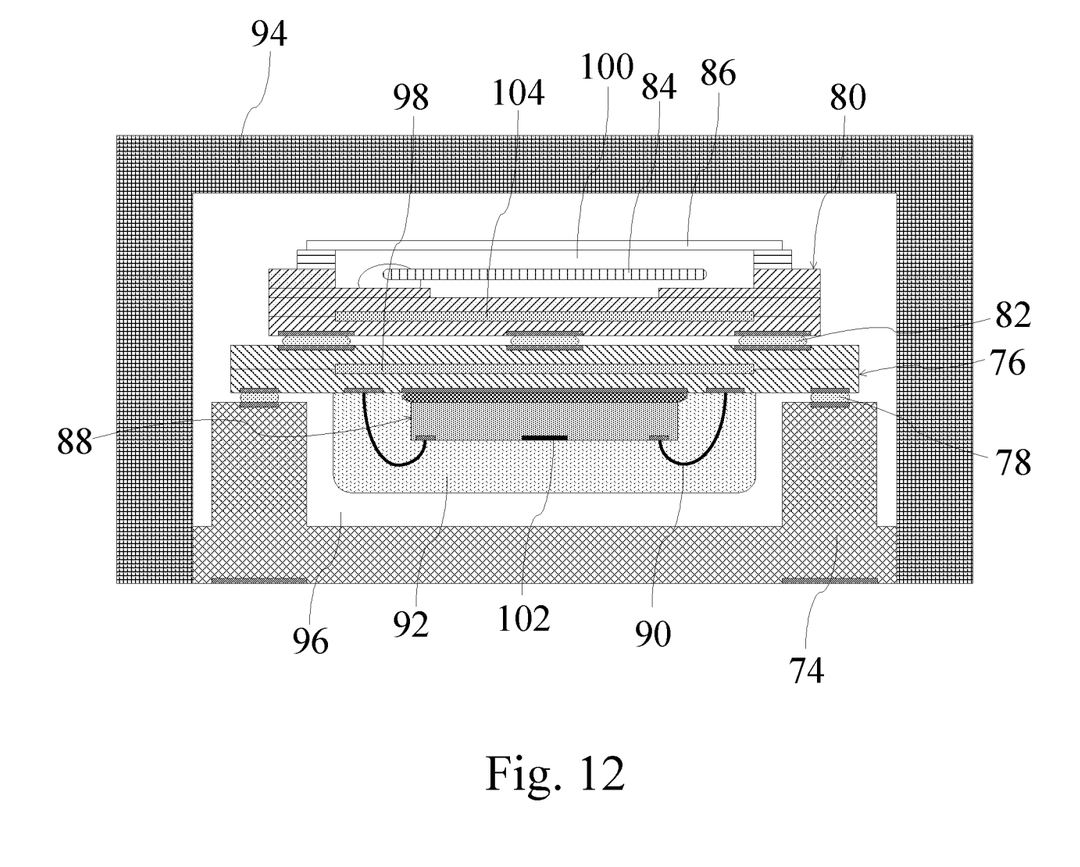
FIG. 12 is a diagram schematically showing an oven controlled crystal oscillator according to the ninth embodiment of the present invention.

Refer to FIG. 12. The ninth embodiment of the present invention is introduced as below. The ninth embodiment is different from the eighth embodiment in the structure of the crystal package 80. In the ninth embodiment, the crystal package 80 is a heater-embedded crystal ceramic package having a second embedded heater layer 104, and the IC chip 88 and the crystal blank 84 are structurally symmetric to the first embedded heater layer 98 and the second embedded heater layer 104. The first embedded heater layer 98 and the second embedded heater layer 104 establishes a symmetric thermal field with respect to the IC chip 88 and the crystal blank 84. The ninth embodiment uses the first embedded heater layer 98 and the second embedded heater layer 104 to form a double-heater oven structure. The IC chip 88 controls the first embedded heater layer 98 and the second embedded heater layer 104 to increase the efficiency of a heater function. The ninth embodiment is also a symmetric structure that the heaters heat upward and downward sides simultaneously. The double-heater structure is useful to maintain the oven stability.

Figure 13:
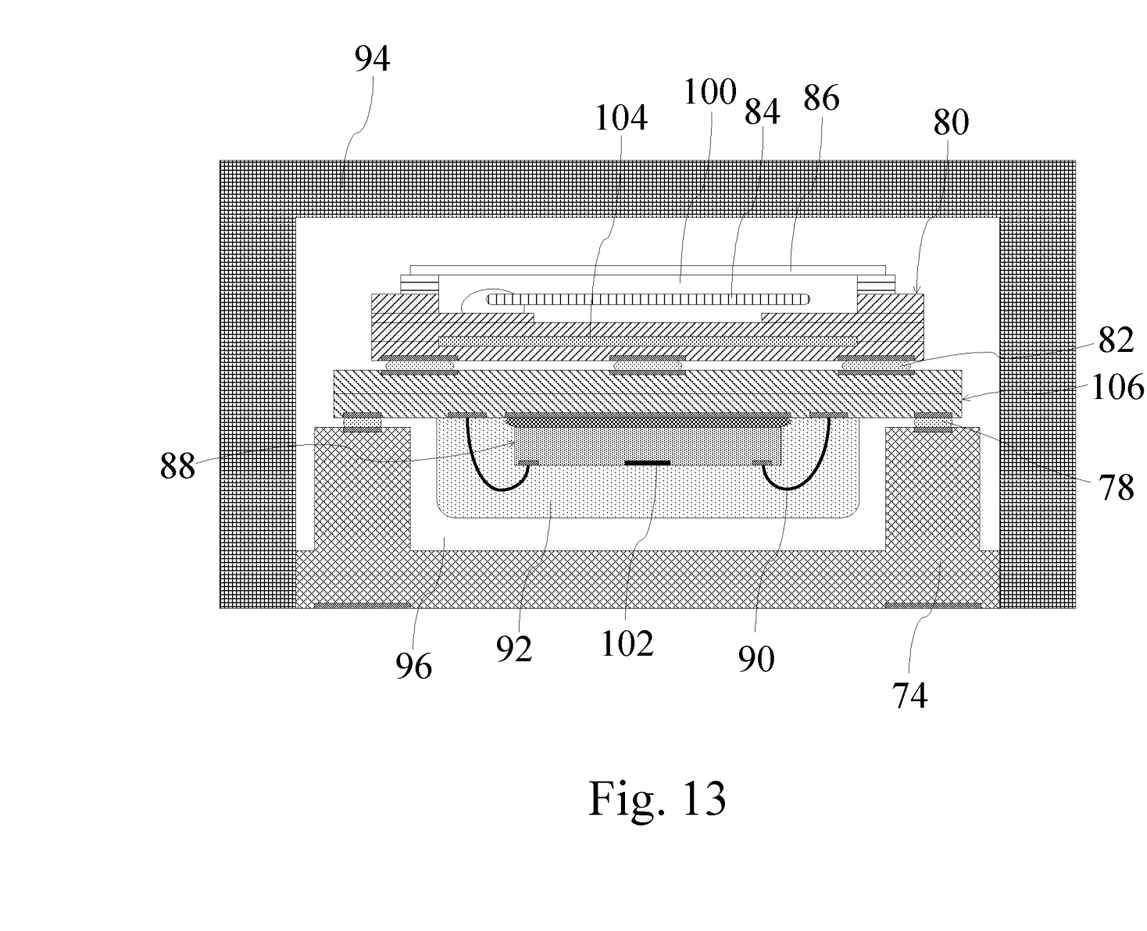
FIG. 13 is a diagram schematically showing an oven controlled crystal oscillator according to the tenth embodiment of the present invention.

Refer to FIG. 12 and FIG. 13. The tenth embodiment of the present invention is introduced as below. The tenth embodiment is different from the ninth embodiment in that the heater-embedded ceramic carrier substrate 76 is replaced with a ceramic carrier substrate 106. Thus, the second embedded heater layer 104 establishes a symmetric thermal field with respect to the IC chip 88 and the crystal blank 84.

The second embedded heater layer 104 heats the structure upward and downward simultaneously, and thus the thermal uniformity is good. As a result, the thermal gradient between the IC chip 88 and the crystal blank 84 is small. Therefore, the structure can achieve very good stability in controlling the oven temperature and good thermal uniformity, maintain good temperature stability of crystal oscillator, and reduce the power consumption. To minimize the temperature difference between the crystal package 80 and the ceramic carrier substrate 106, it is useful to use additional thermal conducting material in the interface between the crystal package 80 and the heater-embedded ceramic carrier substrate 76.

In conclusion, the present invention installs the embedded heater layer on the substrate to establish a symmetric thermal field, thereby achieving good thermal uniformity, maintaining the oven stability and reducing the power consumption.

The embodiments described above are only to exemplify the present invention but not to limit the scope of the present invention. Therefore, any equivalent modification or variation according to the shapes, structures, features, or spirit disclosed by the present invention is to be also included within the scope of the present invention.

What is claimed is:

1. An oven controlled crystal oscillator comprising:
   a substrate;
   a heater-embedded crystal ceramic package, having a first embedded heater layer, mounted on said substrate;
   a crystal blank mounted on said heater-embedded crystal ceramic package; and
   a first integrated circuit (IC) chip mounted below said heater-embedded crystal ceramic package and connected to said heater-embedded crystal ceramic package;
   wherein said first embedded heater layer is located between said first IC chip and said crystal blank.

2. The oven controlled crystal oscillator according to claim 1, wherein said substrate has a first cavity above said substrate; said heater-embedded crystal ceramic package is mounted on said substrate above said first cavity; and said first IC chip is housed inside said first cavity.

3. The oven controlled crystal oscillator according to claim 1, wherein a top of said heater-embedded crystal ceramic package is provided with a second cavity; and said crystal blank is housed in said second cavity.

4. The oven controlled crystal oscillator according to claim 3, further comprising a metal lid mounted on said heater-embedded crystal ceramic package sealing said second cavity.

5. The oven controlled crystal oscillator according to claim 1, wherein said substrate is a print circuit board (PCB) board.

6. The oven controlled crystal oscillator according to claim 1, wherein a bottom of said heater-embedded crystal ceramic package is provided with a third cavity; and said first IC chip is housed in said third cavity.

7. The oven controlled crystal oscillator according to claim 2, wherein said substrate is a heater-embedded ceramic substrate having a second embedded heater layer.

8. The oven controlled crystal oscillator according to claim 7, wherein said substrate further has at least one third embedded heater layer surrounding said first cavity.

9. The oven controlled crystal oscillator according to claim 7, further comprising a second IC chip mounted on said heater-embedded ceramic substrate and in said first cavity connected with said heater-embedded ceramic substrate.

10. The oven controlled crystal oscillator according to claim 1, further comprising a cover lid, wherein said cover lid and said substrate are combined to form a chamber housing said crystal blank, said heater-embedded crystal ceramic package, and said first integrated circuit.

11. The oven controlled crystal oscillator according to claim 10, wherein said cover lid is a heater-embedded ceramic lid having a fourth embedded heater layer.

12. The oven controlled crystal oscillator according to claim 1, wherein said heater-embedded crystal ceramic package comprises a heater-embedded ceramic carrier substrate having said first embedded heater layer, and a crystal package mounted on said heater-embedded ceramic carrier substrate.

13. The oven controlled crystal oscillator according to claim 1, wherein said heater-embedded crystal ceramic package comprises a ceramic carrier substrate, and a heater-embedded crystal package having said first embedded heater layer mounted on said ceramic carrier substrate.

14. The oven controlled crystal oscillator according to claim 1, wherein said heater-embedded crystal ceramic package comprises a heater-embedded ceramic carrier substrate having said first embedded heater layer, and a heater-embedded crystal package having a fifth embedded heater layer mounted on said heater-embedded ceramic carrier substrate.

* * * * *